United States Patent
Kohara

(10) Patent No.: US 7,414,905 B2
(45) Date of Patent: Aug. 19, 2008

(54) SEMICONDUCTOR INTEGRATED CIRCUIT AND TESTING METHOD THEREFOR

(75) Inventor: Koji Kohara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 51 days.

(21) Appl. No.: 11/674,511

(22) Filed: Feb. 13, 2007

(65) Prior Publication Data

US 2007/0189088 A1    Aug. 16, 2007

(30) Foreign Application Priority Data

Feb. 16, 2006    (JP) ............................. 2006-039130

(51) Int. Cl.
*G11C 7/00* (2006.01)

(52) U.S. Cl. ...................................... 365/201; 365/200

(58) Field of Classification Search ................. 365/201, 365/200

See application file for complete search history.

(56) References Cited

U.S. PATENT DOCUMENTS

| 6,067,262 | A  | * | 5/2000 | Irrinki et al. ................. 365/201 |
| 6,091,649 | A  | * | 7/2000 | Choi ........................... 365/200 |
| 6,388,929 | B1 | * | 5/2002 | Shimano et al. .............. 365/201 |
| 6,625,072 | B2 | * | 9/2003 | Ohtani et al. ................ 365/200 |
| 6,728,910 | B1 |   | 4/2004 | Huang |

* cited by examiner

*Primary Examiner*—Anh Phung
(74) *Attorney, Agent, or Firm*—Amin, Turocy & Calvin, LLP

(57) ABSTRACT

The present invention provides a semiconductor integrated circuit that is provided with an address generation circuit that selectively generates an address of a memory cell substituted by a redundancy memory cell based on a defective memory cell address retained in an address retention circuit, and a control circuit that selectively tests the redundancy memory cell by performing a retest on whether the substitution is successful or not based on the address generated by the address generation circuit.

20 Claims, 2 Drawing Sheets

SEMICONDUCTOR INTEGRATED CIRCUIT AND TESTING METHOD THEREFOR

CROSS REFERENCE TO RELATED APPLICATION

This application is based upon and claims the benefit of priority from the prior Japanese Patent Application No. 2006-39130, filed on Feb. 16, 2006, the entire contents of which are incorporated herein by reference.

BACKGROUND OF THE INVENTION

The present invention relates to a semiconductor integrated circuit and a testing method therefor.

In recent years, various methods for recovering defective memory cells that exist in a semiconductor memory have been developed. One such method tests a semiconductor memory to detect a defective memory cell, and substitutes the detected defective memory cell with a redundancy memory cell in order to enable the memory to function as a normal semiconductor memory.

More specifically, the method first tests all memory cells in order to detect a defective memory cell. Then, by storing an address of this defective memory cell into a fuse or the like, the method substitutes the defective memory cell with a redundancy memory cell.

Finally, the method once again tests all memory cells to perform a retest on whether the substitution has been successfully performed. This method has a problem in that a long testing time is required, since all memory cells are subjected to testing even during the retest.

The following is a patent document related to rescue of defective memory cells.

Japanese Patent Laid-Open No. 2002-93190

SUMMARY OF THE INVENTION

A semiconductor integrated circuit according to an aspect of the present invention is provided with:

a memory to be tested that substitutes a memory cell to be written on and read out with a redundancy memory cell when the address of the memory cell to be written on and read out matches a defective memory cell address;

a nonvolatile memory element that stores the defective memory cell address detected by testing the memory, and supplies the defective memory cell address to the memory;

a readout circuit that reads out the defective memory cell address from the nonvolatile memory element;

an address retention circuit that retains the defective memory cell address read out by the readout circuit;

an address generation circuit that selectively generates, based on the defective memory cell address retained in the address retention circuit, an address of the memory cell substituted by the redundancy memory cell; and a control circuit that selectively tests the redundancy memory cell, based on the address generated by the address generation circuit, by performing a retest on whether the substitution is successful or not.

A method for testing a semiconductor integrated circuit according to an aspect of the present invention is provided with, when performing a retest on a memory to be tested, which substitutes a memory cell to be written on and read out with a redundancy memory cell, on whether the substitution is successful or not in the event that an address of the memory cell to be written on and read out matches a defective memory cell address stored in a nonvolatile memory element, the method including:

reading out the defective memory cell address from the nonvolatile memory element;

retaining the read out defective memory cell address;

selectively generating, based on the retained defective memory cell address, an address of the memory cell substituted by the redundancy memory cell; and selectively testing the redundancy memory cell, based on the generated address, by performing a retest on whether the substitution is successful or not.

DETAILED DESCRIPTION OF THE INVENTION

Preferred embodiments of the present invention will now be described with reference to the drawings.

(1) First Embodiment

Figure 1:
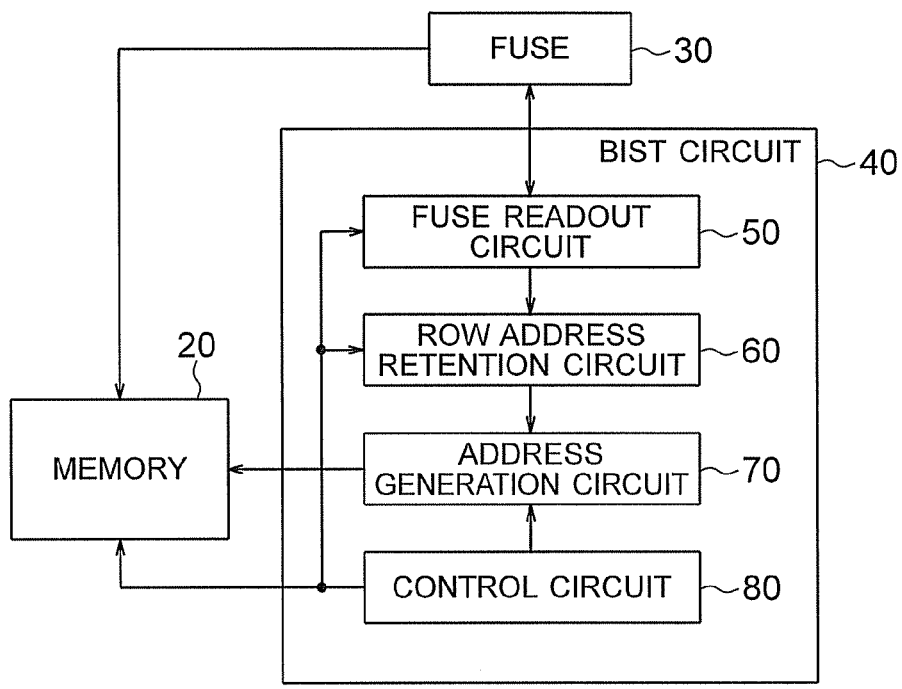
FIG. 1 is a block diagram showing a configuration of a semiconductor integrated circuit according to a first embodiment of the present invention.
Figure 2:
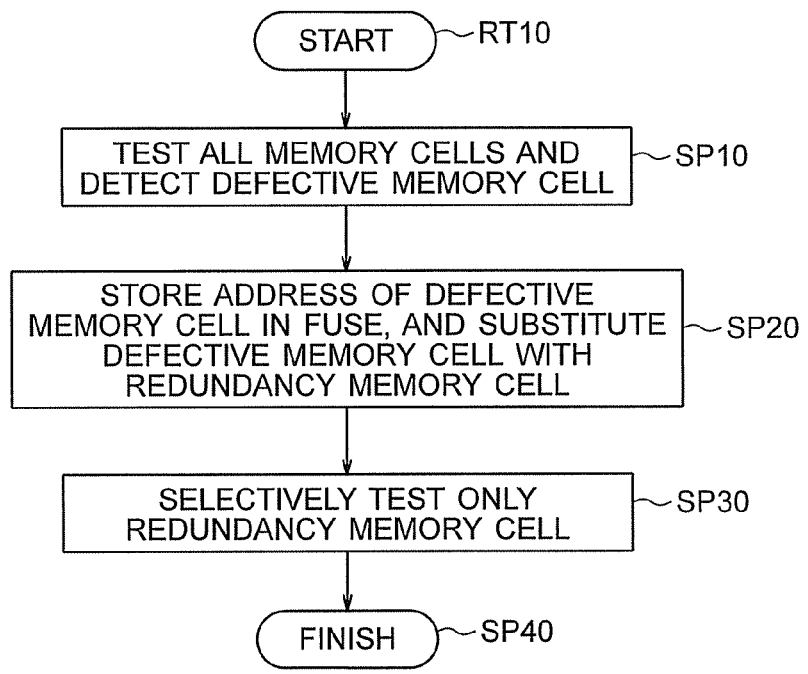
FIG. 2 is a flowchart showing a procedure of test processing.

A configuration of a semiconductor integrated circuit 10 according to a first embodiment of the present invention is shown in FIG. 1. A procedure of test processing RT10 according to the present invention is shown in FIG. 2. The semiconductor integrated circuit 10 is provided with: a memory 20 to be tested that consists of, for instance, a SRAM; a fuse 30 as a nonvolatile memory element; and a BIST (built-in self test) circuit 40.

The BIST circuit 40 is provided with: a fuse readout circuit 50; a row address retention circuit 60; an address generation circuit 70 that generates an address of a memory cell to be written on or read out; and a control circuit 80 that controls operations of the fuse readout circuit 50, the row address retention circuit 60 and the address generation circuit 70. An expected value generation circuit and a comparison circuit or the like, which may be configured in a similar manner as general BIST circuits, have been omitted.

As shown in FIG. 2, when the semiconductor integrated circuit 10 is connected to a semiconductor testing apparatus (tester), not shown, and the test processing procedure RT10 is commenced, the control circuit 80 of the BIST circuit 40 controls the operation of the address generation circuit 70 in step SP10 to generate an address of a memory cell to be written on and read out, and supplies the generated address, together with a write and read control signal to the memory 20.

As a result, by sequentially performing write and read on a per-memory cell basis on all memory cells constituting the memory 20, the control circuit 80 detects a defective memory cell.

In step SP20, the control circuit 80 of the BIST circuit 40 stores a row address of the detected defective memory cell (hereinafter referred to as a "defective memory cell row address") in the fuse 30 via a tester, not shown. The fuse 30 supplies the stored defective memory cell row address to the memory 20.

The memory 20 is equipped with a so-called redundancy function and when, for instance, a row address supplied from the address generation circuit 70 of the BIST circuit 40 matches the defective memory cell row address supplied from the fuse 30, the memory 20 substitutes the defective memory cell with a redundancy memory cell and performs write and read.

In the present embodiment, the memory 20 is provided with a redundancy area in which a plurality of redundancy memory cells are disposed along a row direction. Thus, a memory cell area, of which a plurality is disposed along a row direction, is used as a substitution unit.

In step SP30, the control circuit 80 of the BIST circuit 40 controls operations of the fuse readout circuit 50, the row address retention circuit 60 and the address generation circuit 70 to perform a retest on whether the substitution is successful or not.

More specifically, the fuse readout circuit 50 first reads out a defective memory cell row address from the fuse 30, and stores the same in the row address retention circuit 60. In the event that a plurality of defective memory cell row addresses are detected, the row address retention circuit 60 will retain all of the plurality of defective memory cell row addresses.

The row address retention circuit 60 supplies the retained defective memory cell row address to the address generation circuit 70. The address generation circuit 70 generates an address of a memory cell to be written on and read out by fixing a row address to the defective memory cell row address and generating a column address in the same manner as in a normal test (the test performed in step SP10), and supplies the generated address to the memory 20. As described, the address generation circuit 70 selectively generates an address of a memory cell sequence of which a plurality is disposed in the defective memory cell row address.

At the same time, the control circuit 80 supplies a write and read control signal to the memory 20. In this case, when a defective memory cell row address is supplied from the address generation circuit 70, the memory 20 performs write and read after substituting the memory cell area to be written on and read out with a redundancy memory cell area. As described, the control circuit 80 selectively tests only a redundancy memory cell that has not been tested in step SP10, and proceeds to step SP40 to conclude the processing procedure RT10.

As seen, the present embodiment enables testing time required for retesting whether the substitution is successful or not to be significantly reduced as compared to a comparative example in which all memory cells are retested, and therefore enables reduction of the overall testing time.

For instance, in a case in which a single row's worth of redundancy memory cell sequences are provided with respect to 128 row's worth of memory cell sequences, while a retest according to the comparative example will require 128 rows' worth of addresses to be generated, the present embodiment will require only one row's worth of addresses to be generated. As a result, while also dependent on the configuration of the memory 20, the present embodiment enables reduction of testing time required for retest up to $\frac{1}{128}$ of the testing time according to the comparative example.

(2) Second Embodiment

Figure 3:
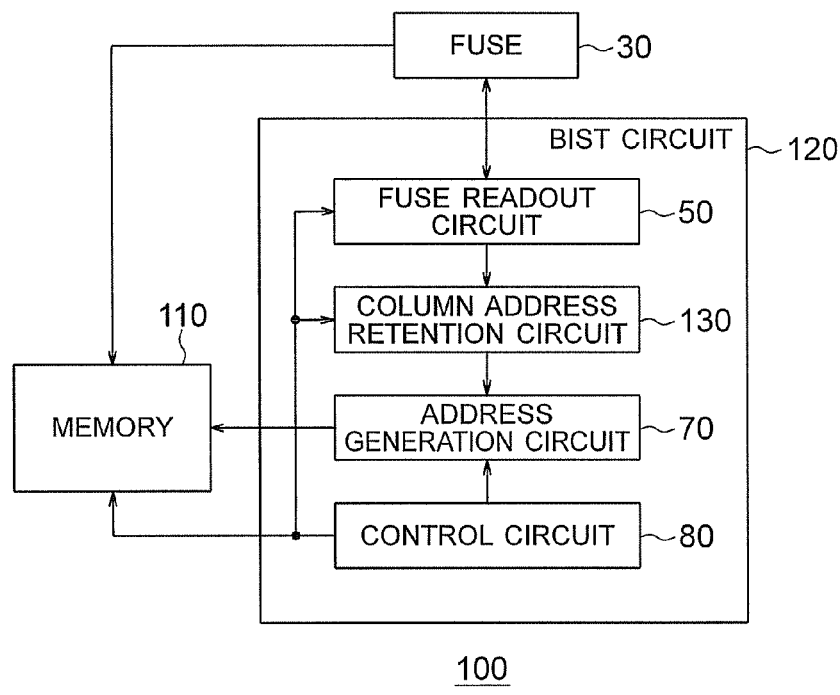
FIG. 3 is a block diagram showing a configuration of a semiconductor integrated circuit according to a second embodiment of the present invention.

A configuration of a semiconductor integrated circuit 100 according to a second embodiment of the present invention is shown in FIG. 3. Like elements to those shown in FIG. 1 are designated by like reference numerals, and descriptions thereof will be omitted.

In the present embodiment, a memory 110 is provided with a redundancy area in which a plurality of redundancy memory cells are disposed along a column direction. Thus, a memory cell area, of which a plurality is disposed along a column direction, is used as a substitution unit.

Therefore, the control circuit 80 of a BIST circuit 120 stores a column address of a detected defective memory cell (hereinafter referred to as a "defective memory cell column address") in the fuse 30 via a tester, not shown. The fuse readout circuit 50 first reads out the defective memory cell column address from the fuse 30, and stores the same in a column address retention circuit 130.

The column address retention circuit 130 supplies the retained defective memory cell column address to the address generation circuit 70. The address generation circuit 70 generates an address of a memory cell to be written on and read out by fixing a column address to the defective memory cell column address and generating a row address in the same manner as in a normal test (the test performed in step SP10), and supplies the generated address to the memory 110. As described, the address generation circuit 70 performs a retest on whether the substitution is successful or not by selectively generating an address of a memory cell sequence of which a plurality is disposed in the defective memory cell column address.

As seen, in the same manner as the first embodiment, the present embodiment enables testing time required for retesting whether the substitution is successful or not to be significantly reduced as compared to a comparative example in which all memory cells are retested, and therefore enables reduction of the overall testing time.

For instance, in a case in which a single column's worth of redundancy memory cell sequences are provided with respect to 128 columns' worth of memory cell sequences, while a retest according to the comparative example will require 128 columns' worth of addresses to be generated, the present embodiment will require only one column's worth of addresses to be generated. As a result, while also dependent on the configuration of the memory 110, the present embodiment enables reduction of testing time required for retest up to $\frac{1}{128}$ of the testing time according to the comparative example.

(3) Third Embodiment

Figure 4:
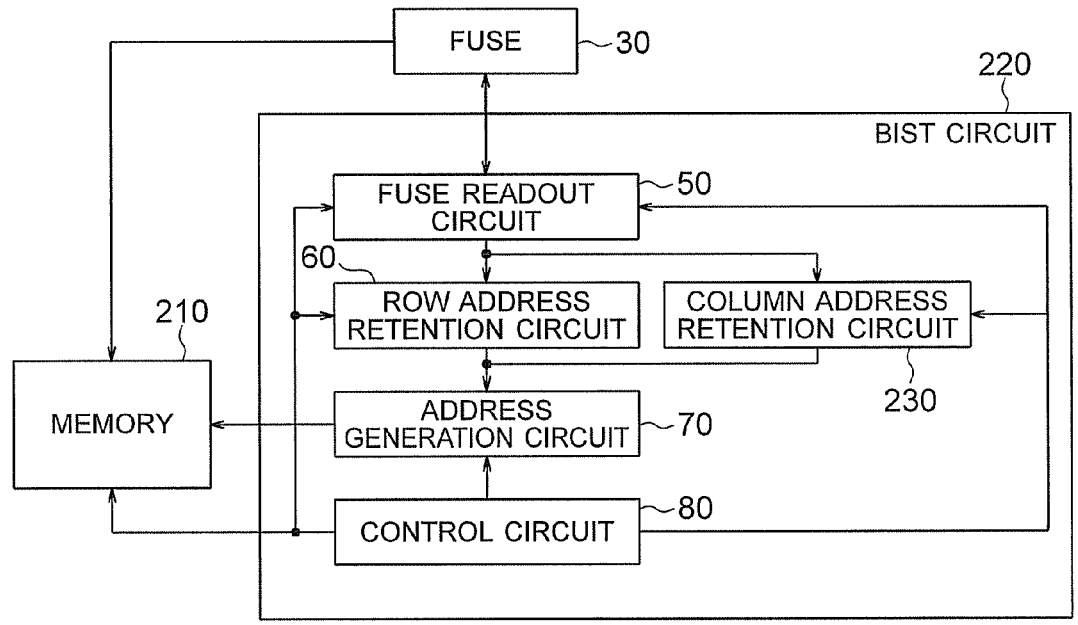
FIG. 4 is a block diagram showing a configuration of a semiconductor integrated circuit according to a third embodiment of the present invention.

A configuration of a semiconductor integrated circuit 200 according to a third embodiment of the present invention is shown in FIG. 4. Like elements to those shown in FIG. 1 are designated by like reference numerals, and descriptions thereof will be omitted.

In the present embodiment, a memory 210 is provided with a first redundancy area in which a plurality of redundancy memory cells are disposed along a row direction and a second redundancy area in which a plurality of redundancy memory cells are disposed along a column direction. Thus, a memory cell area, of which a plurality is disposed along a row direction, and a memory cell area, of which a plurality is disposed along a column direction, are used as substitution units.

Therefore, when, for instance, a plurality of defective memory cells are detected, the control circuit 80 of a BIST circuit 220 stores a defective memory cell row address of one of the detected plurality of defective memory cells in the fuse 30, and also stores a defective memory cell column address of another detected defective memory cell in the fuse 30.

The fuse readout circuit 50 reads out the defective memory cell row address from the fuse 30 and stores the same in the row address retention circuit 60, and also reads out the defective memory cell column address from the fuse 30 and stores the same in a column address retention circuit 230.

The row address retention circuit 60 supplies the retained defective memory cell row address to the address generation circuit 70. The address generation circuit 70 generates an address of a memory cell to be written on and read out by fixing a row address to the defective memory cell row address and generating a column address in the same manner as in a normal test (the test performed in step SP10), and supplies the generated address to the memory 210.

Subsequently, the column address retention circuit 230 supplies the retained defective memory cell column address to the address generation circuit 70. The address generation circuit 70 generates an address of a memory cell to be written on and read out by fixing a column address to the defective memory cell column address and generating a row address in the same manner as in a normal test (the test performed in step SP10), and supplies the generated address to the memory 210.

As described, the address generation circuit 70 performs a retest on whether the substitution is successful or not by selectively generating an address of a memory cell sequence of which a plurality is disposed in the defective memory cell row address and an address of a memory cell sequence of which a plurality is disposed in the defective memory cell column address.

As seen, in the same manner as the first embodiment, the present embodiment enables testing time required for retesting whether the substitution is successful or not to be significantly reduced as compared to a comparative example in which all memory cells are retested, and therefore enables reduction of the overall testing time.

For instance, in a case in which a single row's worth of redundancy memory cell sequences are provided with respect to 128 rows' worth of memory cell sequences and a single column's worth of redundancy memory cell sequences are provided with respect to 128 columns' worth of memory cell sequences, while a retest according to the comparative example will require 128 rows' and 128 columns' worth of addresses to be generated, the present embodiment will require only one row's and one column's worth of addresses to be generated. As a result, the present embodiment enables reduction of testing time required for retest up to $1/64$ ($=1/128+1/128$) of the testing time according to the comparative example.

The above embodiments are merely exemplary, and the present invention is not limited to such embodiments. For instance, instead of a SRAM, a DRAM or the like may also be used as the memory to be tested.

What is claimed is:

1. A semiconductor integrated circuit comprising:
    a memory to be tested that substitutes a memory cell to be written on and read out with a redundancy memory cell when the address of the memory cell to be written on and read out matches a defective memory cell address;
    a nonvolatile memory element that stores the defective memory cell address detected by testing the memory, and supplies the defective memory cell address to the memory;
    a readout circuit that reads out the defective memory cell address from the nonvolatile memory element;
    an address retention circuit that retains the defective memory cell address read out by the readout circuit;
    an address generation circuit that selectively generates, based on the defective memory cell address retained in the address retention circuit, an address of the memory cell substituted by the redundancy memory cell; and
    a control circuit that selectively tests the redundancy memory cell, based on the address generated by the address generation circuit, by performing a retest on whether the substitution is successful or not.

2. The semiconductor integrated circuit according to claim 1, wherein the memory comprises a redundancy area in which a plurality of the redundancy memory cells are disposed along a row direction, and
    the address generation circuit selectively generates an address of the memory cell substituted by the redundancy memory cell by fixing a row address to the defective memory cell row address and subsequently generating a column address.

3. The semiconductor integrated circuit according to claim 1, wherein the memory comprises a redundancy area in which a plurality of the redundancy memory cells are disposed along a column direction, and
    the address generation circuit selectively generates an address of the memory cell substituted by the redundancy memory cell by fixing a column address to the defective memory cell column address and subsequently generating a row address.

4. The semiconductor integrated circuit according to claim 1, wherein the memory comprises a first redundancy area in which a plurality of the redundancy memory cells are disposed along a row direction and a second redundancy area in which a plurality of the redundancy memory cells are disposed along a column direction, and
    the address generation circuit selectively generates an address of the memory cell substituted by the first redundancy memory cell by fixing a row address to the defective memory cell row address and subsequently generating a column address, and selectively generates an address of the memory cell substituted by the second redundancy memory cell by fixing a column address to the defective memory cell column address and subsequently generating a row address.

5. The semiconductor integrated circuit according to claim 4, wherein the address retention circuit comprises a row address retention circuit that retains the defective memory cell row address read out by the readout circuit and a column address retention circuit that retains the defective memory cell column address read out by the readout circuit.

6. The semiconductor integrated circuit according to claim 4, wherein the nonvolatile memory element stores a defective memory cell row address and a defective memory cell column address detected by testing the memory.

7. The semiconductor integrated circuit according to claim 1, wherein the nonvolatile memory element consists of a fuse.

8. The semiconductor integrated circuit according to claim 1, wherein the nonvolatile memory element stores a defective memory cell address detected by sequentially performing write and read on a per-memory cell basis on all memory cells constituting the memory.

9. The semiconductor integrated circuit according to claim 1, wherein the memory cells are arranged in a matrix pattern in the memory.

10. The semiconductor integrated circuit according to claim 1, wherein the memory consists of a SRAM or a DRAM.

11. A method for testing a semiconductor integrated circuit comprising, when performing a retest on a memory to be tested, which substitutes a memory cell to be written on and read out with a redundancy memory cell, on whether the substitution is successful or not in the event that an address of the memory cell to be written on and read out matches a defective memory cell address stored in a nonvolatile memory element, the method comprising:
- reading out the defective memory cell address from the nonvolatile memory element;
- retaining the read out defective memory cell address;
- selectively generating, based on the retained defective memory cell address, an address of the memory cell substituted by the redundancy memory cell; and
- selectively testing the redundancy memory cell, based on the generated address, by performing a retest on whether the substitution is successful or not.

12. The method for testing a semiconductor integrated circuit according to claim 11, wherein the memory comprises a redundancy area in which a plurality of the redundancy memory cells are disposed along a row direction, and
- when selectively generating an address of the memory cell substituted by the redundancy memory cell, the method fixes a row address to the defective memory cell row address and subsequently generates a column address.

13. The method for testing a semiconductor integrated circuit according to claim 11, wherein the memory comprises a redundancy area in which a plurality of the redundancy memory cells are disposed along a column direction, and
- when selectively generating an address of the memory cell substituted by the redundancy memory cell, the method fixes a column address to the defective memory cell column address and subsequently generates a row address.

14. The method for testing a semiconductor integrated circuit according to claim 11, wherein the memory comprises a first redundancy area in which a plurality of the redundancy memory cells are disposed along a row direction and a second redundancy area in which a plurality of the redundancy memory cells are disposed along a column direction, and the method selectively generates an address of the memory cell substituted by the first redundancy memory cell by fixing a row address to the defective memory cell row address and subsequently generating a column address, and selectively generates an address of the memory cell substituted by the second redundancy memory cell by fixing a column address to the defective memory cell column address and subsequently generating a row address.

15. The method for testing a semiconductor integrated circuit according to claim 14, wherein the method retains the defective memory cell row address and the defective memory cell column address when retaining the defective memory cell address.

16. The method for testing a semiconductor integrated circuit according to claim 14, wherein the nonvolatile memory element stores a defective memory cell row address and a defective memory cell column address that are detected by testing the memory.

17. The method for testing a semiconductor integrated circuit according to claim 11, wherein the nonvolatile memory element is comprised of a fuse.

18. The method for testing a semiconductor integrated circuit according to claim 11, wherein the nonvolatile memory element stores the defective memory cell address detected by sequentially performing write and read on a per-memory cell basis on all memory cells constituting the memory.

19. The method for testing a semiconductor integrated circuit according to claim 11, wherein the memory cells are arranged in a matrix pattern in the memory.

20. The method for testing a semiconductor integrated circuit according to claim 11, wherein the memory is comprised of a SRAM or a DRAM.

* * * * *